US010347664B2

(12) United States Patent
Wang

(10) Patent No.: US 10,347,664 B2
(45) Date of Patent: Jul. 9, 2019

(54) RGBW DISPLAY PANEL

(71) Applicant: Wuhan China Star Optoelectronics Technology Co., Ltd., Wuhan (CN)

(72) Inventor: Cong Wang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 23 days.

(21) Appl. No.: 15/542,653

(22) PCT Filed: May 18, 2017

(86) PCT No.: PCT/CN2017/084977
§ 371 (c)(1),
(2) Date: Jul. 11, 2017

(87) PCT Pub. No.: WO2018/188159
PCT Pub. Date: Oct. 18, 2018

(65) Prior Publication Data
US 2018/0301468 A1 Oct. 18, 2018

(30) Foreign Application Priority Data

Apr. 12, 2017 (CN) .......................... 2017 1 0237243

(51) Int. Cl.
*H01L 27/14* (2006.01)
*H01L 29/04* (2006.01)
(Continued)

(52) U.S. Cl.
CPC .......... *H01L 27/124* (2013.01); *G02F 1/1362* (2013.01); *H01L 27/3244* (2013.01);
(Continued)

(58) Field of Classification Search
None
See application file for complete search history.

(56) References Cited

U.S. PATENT DOCUMENTS 6,222,599 B1* 4/2001 Yoshida ............ G02F 1/134363
349/106
2005/0259142 A1* 11/2005 Kwak .................. G09G 3/3233
347/238

(Continued)

FOREIGN PATENT DOCUMENTS

CN 101889358 A 11/2010
CN 102779495 A 11/2012
(Continued)

*Primary Examiner* — Calvin Y Choi
(74) *Attorney, Agent, or Firm* — Leong C. Lei

(57) ABSTRACT

The invention provides an RGBW display panel, or vertically adjacent or horizontally adjacent red sub-pixels, green sub-pixels, blue sub-pixels, and white sub-pixels (W), the TFTs for the red sub-pixels, green sub-pixels, and blue sub-pixels being disposed inside the white sub-pixels (W), and disposing bend portion (11) on borders of the sub-pixels left and right to the white sub-pixel (W) to reduce the aperture ratios of the sub-pixels left and right to the white sub-pixel (W), and increase the aperture ratios of the sub-pixels located above and below the white sub-pixel. As such, the aperture ratios of the red, green, and blue sub-pixels around the white sub-pixel approximate consistency to improve the darker shade problems of RGBW display panel display a solid or two-color mixture screen, as well as avoid white color coordinate drift, improve color shift and improve display quality.

8 Claims, 2 Drawing Sheets

(51) Int. Cl.
  *H01L 29/15* (2006.01)
  *H01L 31/036* (2006.01)
  *H01L 27/12* (2006.01)
  *H01L 29/786* (2006.01)
  *G02F 1/1362* (2006.01)
  *H01L 27/32* (2006.01)

(52) U.S. Cl.
  CPC .... *H01L 29/78675* (2013.01); *H01L 27/1222* (2013.01); *H01L 29/78633* (2013.01); *H01L 29/78645* (2013.01); *H01L 29/78696* (2013.01)

(56) References Cited

U.S. PATENT DOCUMENTS

| | | |
|---|---|---|
| 2012/0268357 A1 | 10/2012 | Shih |
| 2015/0092135 A1 | 4/2015 | Jeon |
| 2016/0116808 A1 | 4/2016 | Higano et al. |
| 2016/0178981 A1* | 6/2016 | Lee .................. G02F 1/136213 257/71 |
| 2016/0307488 A1* | 10/2016 | Kim .................... G09G 3/3266 |
| 2017/0059914 A1* | 3/2017 | Huang ................ G02F 1/13394 |

FOREIGN PATENT DOCUMENTS

| | | |
|---|---|---|
| CN | 103033974 A | 4/2013 |
| CN | 105425451 A | 3/2016 |

\* cited by examiner

RGBW DISPLAY PANEL

BACKGROUND OF THE INVENTION

1. Field of the Invention

The present invention relates to the field of display, and in particular to an RGBW display panel.

2. The Related Arts

Both the liquid crystal display (LCD) and organic light-emitting diode (OLED) display panel comprise a plurality of pixels arranged in an array. The conventional pixels comprise red (R), green (G), and blue (B) sub-pixels, with each sub-pixel controlled by a corresponding thin film transistor (TFT). In the known technology, the R, G, B color filters are light-absorbing type. When the light enters, only the light with corresponding color can pass through, and the light of the other two colors are absorbed, resulting in low transmission rate of the display panel. Thus, a display technique is developed wherein four sub-pixels of red, green, blue, and white (W) colors are formed in a pixel, in which no color layer is added for the W sub-pixel. By controlling the corresponding grayscale of the W sub-pixel, the light transmission rate of the display panel is improved. This type of display panel is often referred to as RGBW display panel.

The RGBW display panel can improve the luminance of a white screen, and greatly reduces the backlight power consumption to achieve cost-saving. However, in RGBW display panel, the W sub-pixel will be turned on according to the lowest grayscale luminance of the other three sub-pixels only when the three sub-pixels R, G and B of the pixel are completely turned on; otherwise, the W sub-pixel does not show. This display effect has some drawbacks, mainly in the display of solid color or two-color mixture image, compared with the traditional RGB three-color display mode, the RGBW display panel displays a darker shade of solid or mixed color. For example, displaying yellow image (the mixture of red and green) on a white background, the yellow displayed by the RGBW display panel be in a darker shade than the yellow displayed by the traditional RGB display panel.

A known approach for improving the RGBW display panel in solid or mixed color image is to design the TFTs of the red, green, and blue sub-pixels in the white sub-pixels, i.e., by sacrificing the aperture ratio of the white sub-pixels to increase the aperture ratios of the red, green and blue sub-pixels, so as to increase the display luminance of solid or two-color mixture image. FIG. 1 shows an improved RGBW display panel, wherein the three TFTs T10 of the red, green and blue sub-pixel are disposed in the white sub-pixel W, and the gate line 100 is in the form of a straight line. Assume that the nominal size of each sub-pixel is a×b, and the width of the black matrix BM shielding is s. As shown FIG. 1, the aperture ratio of the sub-pixels located above and below the white sub-pixel W suffers loss. Furthermore, the aperture ratio loss of the sub-pixels above and below the white sub-pixel W is mainly in the semiconductor layer 30 and the shielding layer 20 covering the sub-pixel are. According to the sub-pixel design rule, the semiconductor layer 30 entering into the sub-pixel and overlapping with the sub-pixel has a height of l the width of m, then the loss rate $\Delta AR$ of the aperture ratio for the sub-pixels located above and below the white sub-pixel W is:

$$\Delta AR = 4 \times (l \times m)/(a \times b)$$

While the sub-pixels located left and right to the white sub-pixel W do not suffer aperture ratio loss, and the aperture ratio is clearly greater than the aperture ratio of the sub-pixels located above and below the white sub-pixel W, which leads to a large aperture ratio difference among the red, green, and blue sub-pixels, resulting in white color coordinate drift in actual display and color shift to affect the display quality.

SUMMARY OF THE INVENTION

The object of the present invention is to provide an RGBW display panel, able to improve the problem of darker shade in RGBW display panel when displaying a solid color or two-color mixture screen, and avoid the white color coordinate drift causing color shift to affect the display quality.

To achieve the above object, the present invention provides an RGBW display panel, comprising: a plurality of gate lines, a plurality of data lines intersecting with the plurality of gate data in an insulating manner, a plurality of sub-pixels defined by the plurality of gate lines and the plurality of data lines and arranged in an array, a plurality of thin film transistors (TFTs), and a black matrix covering the gate lines and data lines; a TFT is disposed correspondingly to a sub-pixel;

the plurality of sub-pixels comprising a plurality of red sub-pixels, a plurality of green sub-pixels, a plurality of blue sub-pixels, and a plurality of white sub-pixels; for vertically adjacent or horizontally adjacent red sub-pixels, green sub-pixels, blue sub-pixels, and white sub-pixels, the TFTs for the red sub-pixels, green sub-pixels, and blue sub-pixels being disposed inside the white sub-pixels;

each gate line comprising a plurality of bend portions, the bend portions being located on borders of the sub-pixels left and right to the white sub-pixel to increase the aperture ratio of the sub-pixels located above and below the white sub-pixel.

According to a preferred embodiment of the present invention, the bend portion comprises a first bend segment and a second bend segment; the first bend segment is relatively far away from the white sub-pixel and bends towards the white sub-pixel; and the second bend segment is relatively near the white sub-pixel and bends towards the white sub-pixel.

According to a preferred embodiment of the present invention, the bend portion further comprises a straight segment connecting the first bend segment and the second bend segment.

According to a preferred embodiment of the present invention, each gate line further comprises a straight portion disposed between two bending portions for connecting the two bend portions.

According to a preferred embodiment of the present invention, a TFT is located at four corners of the white sub-pixel respectively; the TFT comprises a semiconductor layer, a gate disposed above the semiconductor layer, insulated from the semiconductor layer and connected to the gate line, a source disposed above the gate, insulated from the gate and connected to the data line, a drain at the same layer as the data line; the drain is connected to the semiconductor layer;

a portion of the semiconductor layer extends beyond the white sub-pixel and enters the sub-pixels above and below the white sub-pixel.

According to a preferred embodiment of the present invention, the height difference between highest point and lowest point of the first bend segment is equal to the height difference between highest point and lowest point of the second bend segment; the angle between the first bend segment and a vertical direction is equal to the angle between the second bend segment and a vertical direction.

According to a preferred embodiment of the present invention, assume that both the height difference between highest point and lowest point of the first bend segment and the height difference between highest point and lowest point of the second bend segment are d; both the angle between the first bend segment and a vertical direction and the angle between the second bend segment and a vertical direction are α, the aperture ratio increment ΔAR2 for the sub-pixels above and below the white sub-pixel is:

$$\Delta AR2=2\times s\times d/(a\times b),$$

wherein a is the nominal height of the sub-pixel, b is the nominal width of the sub-pixel, s is the shielding width of the black matrix.

According to a preferred embodiment of the present invention, the equation for computing the height difference between highest point and lowest point of the first bend segment and the height difference between highest point and lowest point of the second bend segment d is:

$$d=2\times l\times m/[s(tg\alpha-1)+b],$$

wherein l is the height of the semiconductor layer of the TFT entering the sub-pixels above and below the white sub-pixel overlapping with the corresponding sub-pixel; and m is the width the semiconductor layer of the TFT entering the sub-pixels above and below the white sub-pixel overlapping with the corresponding sub-pixel.

According to a preferred embodiment of the present invention, the RGBW display panel further comprises a substrate, a shielding layer disposed on the substrate and below the semiconductor layer for shielding; the semiconductor layer is made of polysilicon.

The present invention also provides an RGBW display panel, comprising: a plurality of gate lines, a plurality of data lines intersecting with the plurality of gate data in an insulating manner, a plurality of sub-pixels defined by the plurality of gate lines and the plurality of data lines and arranged in an array, a plurality of thin film transistors (TFTs), and a black matrix covering the gate lines and data lines; a TFT is disposed correspondingly to a sub-pixel;

the plurality of sub-pixels comprising a plurality of red sub-pixels, a plurality of green sub-pixels, a plurality of blue sub-pixels, and a plurality of white sub-pixels; for vertically adjacent or horizontally adjacent red sub-pixels, green sub-pixels, blue sub-pixels, and white sub-pixels, the TFTs for the red sub-pixels, green sub-pixels, and blue sub-pixels being disposed inside the white sub-pixels;

each gate line comprising a plurality of bend portions, the bend portions being located on borders of the sub-pixels left and right to the white sub-pixel to increase the aperture ratio of the sub-pixels located above and below the white sub-pixel;

wherein the bend portion comprising a first bend segment and a second bend segment; the first bend segment being relatively far away from the white sub-pixel and bending towards the white sub-pixel; and the second bend segment being relatively near the white sub-pixel and bending towards the white sub-pixel.

wherein, the bend portion further comprising a straight segment connecting the first bend segment and the second bend segment.

Compared to the known techniques, the present invention provides the following advantages: the present invention provides an RGBW display panel, or vertically adjacent or horizontally adjacent red sub-pixels, green sub-pixels, blue sub-pixels, and white sub-pixels, the TFTs for the red sub-pixels, green sub-pixels, and blue sub-pixels being disposed inside the white sub-pixels, and disposing bend portion on borders of the sub-pixels left and right to the white sub-pixel to reduce the aperture ratios of the sub-pixels left and right to the white sub-pixel, and increase the aperture ratios of the sub-pixels located above and below the white sub-pixel. As such, the aperture ratios of the red, green, and blue sub-pixels around the white sub-pixel approximate consistency to improve the darker shade problems of RGBW display panel display a solid or two-color mixture screen, as well as avoid white color coordinate drift, improve color shift and improve display quality.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 2:
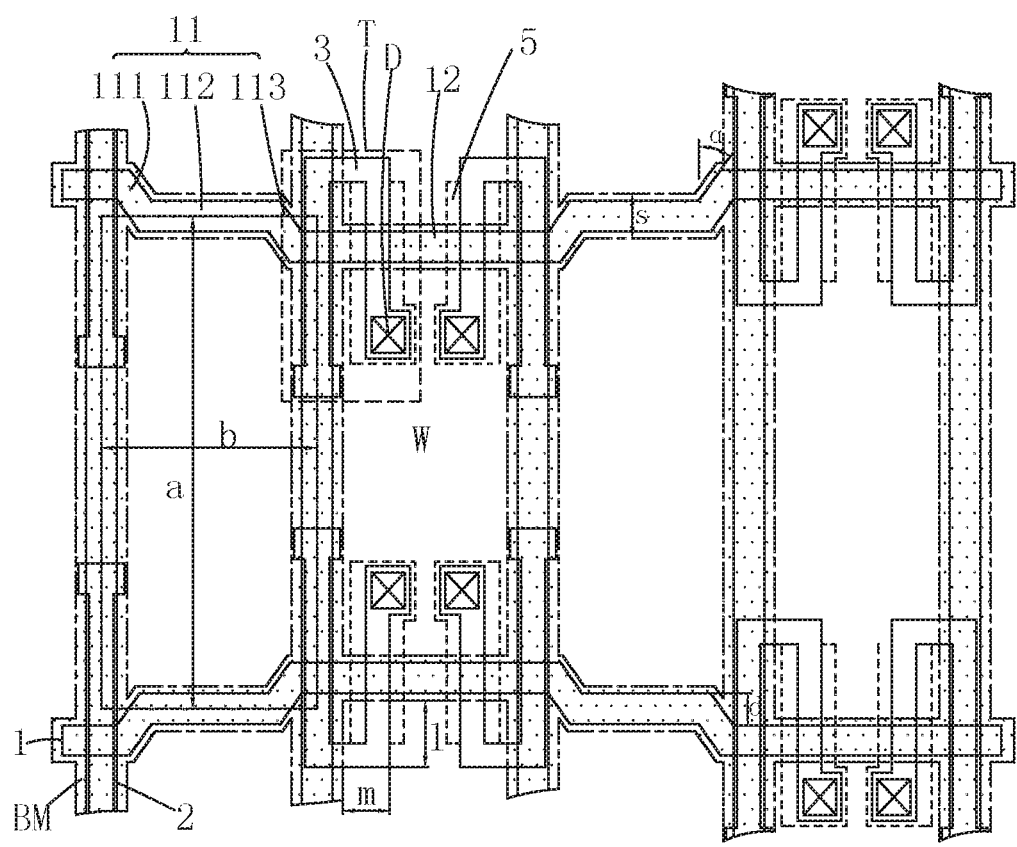
FIG. 2 is a schematic view showing the structure of an RGBW display panel according to the present invention.

Refer to FIG. 2. the present invention provides an RGBW display panel, comprising: a plurality of gate lines 1, a plurality of data lines 2 intersecting with the plurality of gate data 1 in an insulating manner, a plurality of sub-pixels defined by the plurality of gate lines 1 and the plurality of data lines 2 and arranged in an array, a plurality of thin film transistors (TFTs), and a black matrix BM covering the gate lines 1 and data lines 2; a TFT is disposed correspondingly to a sub-pixel.

The plurality of sub-pixels comprises a plurality of red sub-pixels (not shown), a plurality of green sub-pixels (not shown), a plurality of blue sub-pixels (not shown), and a plurality of white sub-pixels W. A gate line 1 is disposed corresponding to each row of sub-pixels.

Each row of sub-pixels comprises a plurality of white sub-pixels W, a plurality of red sub-pixels), a plurality of green sub-pixels, and a plurality of blue sub-pixels. For vertically adjacent or horizontally adjacent red sub-pixels, green sub-pixels, blue sub-pixels, and white sub-pixels W, the TFTs for the red sub-pixels, green sub-pixels, and blue sub-pixels are disposed inside the white sub-pixels W. The advantage of such arrangement is to sacrifice the aperture ratio of the white sub-pixel W to increase the aperture rations of the red, green, and blue sub-pixels to increase the display luminance when displaying a solid color or two-color mixture.

It should be noted that, in the present invention, each gate line 1 comprises a plurality of bend portions 11, the bend portions 11 are located on borders of the sub-pixels left and right to the white sub-pixel W. Furthermore, the bend portions 11 bend toward the white sub-pixels W, and the straight portions 11 are disposed between any two bend portions 11 to connected the two bend portions 11. As such, the aperture ratios of the sub-pixels left and right to the white sub-pixel are reduced, and the aperture ratios of the sub-pixels located above and below the white sub-pixel are increased.

Specifically, a TFT is located at four corners of the white sub-pixel W respectively; the TFT comprises a semiconductor layer 3, a gate disposed above the semiconductor layer 3, insulated from the semiconductor layer 3 and connected to the gate line 1, a source disposed above the gate, insulated from the gate and connected to the data line 2, a drain D at the same layer as the data line 2; the drain D is connected to the semiconductor layer 3. A portion of the semiconductor layer 3 extends beyond the white sub-pixel W and enters the sub-pixels above and below the white sub-pixel W. Furthermore, the RGBW display panel of the present invention further comprises a substrate (not shown), a shielding layer 5 disposed on the substrate and below the semiconductor layer 3 for shielding; the semiconductor layer 3 is made of polysilicon (Poly-Si).

Specifically, the bend portion 11 comprises a first bend segment 111, a second bend segment 113, and a straight segment 112 connecting the first bend segment 111 and the second bend segment 113; the first bend segment 111 is relatively far away from the white sub-pixel W and bends towards the white sub-pixel W; and the second bend segment 113 is relatively near the white sub-pixel W and bends towards the white sub-pixel W. Furthermore, the height difference between highest point and lowest point of the first bend segment 111 is equal to the height difference between highest point and lowest point of the second bend segment 113; the angle between the first bend segment 111 and a vertical direction is equal to the angle between the second bend segment 113 and a vertical direction. Assume that both the height difference between highest point and lowest point of the first bend segment 111 and the height difference between highest point and lowest point of the second bend segment 113 are d; and both the angle between the first bend segment 111 and a vertical direction and the angle between the second bend segment 113 and a vertical direction are α, the aperture ratio decrement ΔAR1 for the sub-pixels left and right to the white sub-pixel W is:

$$\Delta AR1 = 2 \times s \times d \times tg\alpha/(a \times b),$$

wherein s is the shielding width of the black matrix, a is the nominal height of the sub-pixel, and b is the nominal width of the sub-pixel.

The aperture ratio increment ΔAR2 for the sub-pixels above and below the white sub-pixel is:

$$\Delta AR2 = 2 \times (b-s) \times d/(a \times b).$$

Figure 1:
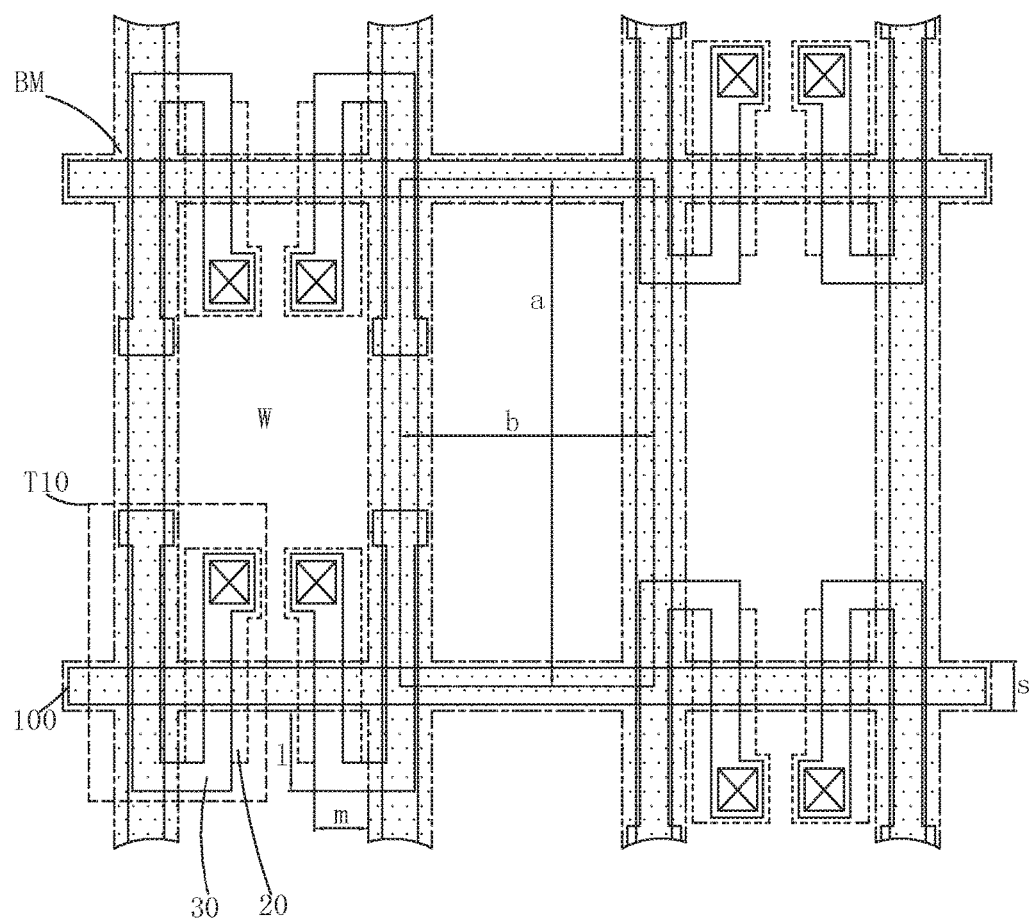
FIG. 1 is a schematic view showing the structure of a known RGBW display panel.

FIG. 1 shows a known RGBW display panel design wherein the gate lines 100 are disposed as straight lines, and all the TFTs of the red, green and blue sub-pixel are disposed in the white sub-pixels W, which leads to aperture ratio loss for the sub-pixels located above and below the white sub-pixel W, while the sub-pixels located left and right to the white sub-pixel W do not suffer aperture ratio loss, and the aperture ratio of the sub-pixels right and left to the sub-pixels W is clearly greater than the aperture ratio of the sub-pixels located above and below the white sub-pixel W, resulting in white color coordinate drift in actual display and color shift. On the other hand, the RGBW display panel designs the each gate line 1 as bend portions 11 bending towards the white sub-pixels W at parts corresponding to the borders of the sub-pixels left and right to the white sub-pixel W, and keeps the remaining parts as straight lines. As such, the aperture ratio for sub-pixels located left and right to the white sub-pixel W decreases, and the sub-pixels located above and below the white sub-pixel W increases, resulting in the aperture ratios of the red, green, and blue sub-pixels surrounding the white sub-pixels approximating consistency to avoid white color coordinate drift, improve color shift and improve display quality.

Furthermore, because the aperture ratio for sub-pixels located left and right to the white sub-pixel W decreases, and the sub-pixels located above and below the white sub-pixel W increases, the total effect on the aperture ratio for the sub-pixels located above and below the white sub-pixel W is equivalent to increase the aperture ratio by ΔAR:

$$\Delta AR = \Delta AR1 + \Delta AR2$$

Furthermore, the equation for computing the height difference d between highest point and lowest point of the first bend segment 111 and the height difference between highest point and lowest point of the second bend segment 113 is:

$$d = 2 \times l \times m/[s(tg\alpha - 1) + b],$$

wherein l is the height of the semiconductor layer 3 of the TFT entering the sub-pixels above and below the white sub-pixel overlapping with the corresponding sub-pixel; and m is the width the semiconductor layer 3 of the TFT entering the sub-pixels above and below the white sub-pixel overlapping with the corresponding sub-pixel.

In summary, the present invention provides an RGBW display panel, or vertically adjacent or horizontally adjacent red sub-pixels, green sub-pixels, blue sub-pixels, and white sub-pixels, the TFTs for the red sub-pixels, green sub-pixels, and blue sub-pixels being disposed inside the white sub-pixels, and disposing bend portion on borders of the sub-pixels left and right to the white sub-pixel to reduce the aperture ratios of the sub-pixels left and right to the white sub-pixel, and increase the aperture ratios of the sub-pixels located above and below the white sub-pixel. As such, the aperture ratios of the red, green, and blue sub-pixels around the white sub-pixel approximate consistency to improve the darker shade problems of RGBW display panel display a solid or two-color mixture screen, as well as avoid white color coordinate drift, improve color shift and improve display quality.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An RGBW display panel, comprising: a plurality of gate lines, a plurality of data lines intersecting with the plurality of gate data in an insulating manner, a plurality of sub-pixels defined by the plurality of gate lines and the plurality of data lines and arranged in an array, a plurality of thin film transistors (TFTs), and a black matrix covering the gate lines and data lines; a TFT is disposed correspondingly to a sub-pixel;

the plurality of sub-pixels comprising a plurality of red sub-pixels, a plurality of green sub-pixels, a plurality of blue sub-pixels, and a plurality of white sub-pixels; for vertically adjacent or horizontally adjacent red sub-pixels, green sub-pixels, blue sub-pixels, and white sub-pixels, the TFTs for the red sub-pixels, green sub-pixels, and blue sub-pixels being disposed inside the white sub-pixels;

each gate line comprising a plurality of bend portions, the bend portions being located on borders of the sub-pixels left and right to the white sub-pixel to increase the aperture ratio of the sub-pixels located above and below the white sub-pixel;

wherein the bend portion comprises a first bend segment and a second bend segment; the first bend segment is relatively far away from the white sub-pixel and bends towards the white sub-pixel; and the second bend segment is relatively near the white sub-pixel and bends towards the white sub-pixel;

wherein a TFT is located at each of four corners of the white sub-pixel respectively; the TFT comprises a semiconductor layer, a gate disposed above the semiconductor layer, insulated from the semiconductor layer and connected to the gate line, a source disposed above the gate, insulated from the gate and connected to the data line, a drain at the same layer as the data line; the drain is connected to the semiconductor layer;

a portion of the semiconductor layer extends beyond the white sub-pixel and enters the sub-pixels above and below the white sub-pixel;

wherein the height difference between highest point and lowest point of the first bend segment is equal to the height difference between highest point and lowest point of the second bend segment; the angle between the first bend segment and a vertical direction is equal to the angle between the second bend segment and a vertical direction;

wherein assume that both the height difference between highest point and lowest point of the first bend segment and the height difference between highest point and lowest point of the second bend segment are d; both the angle between the first bend segment and a vertical direction and the angle between the second bend segment and a vertical direction are $\alpha$, the aperture ratio increment $\Delta AR2$ for the sub-pixels above and below the white sub-pixel is:

$$\Delta AR2 = 2 \times (b-s) \times d/(a \times b),$$

wherein a is the nominal height of the sub-pixel, b is the nominal width of the sub-pixel, and s is the shielding width of the black matrix;

wherein the equation for computing the height difference between highest point and lowest point of the first bend segment and the height difference between highest point and lowest point of the second bend segment d is:

$$d = 2 \times 1 \times m/[s(tg\alpha - 1) + b],$$

wherein 1 is the height of the semiconductor layer of the TFT entering the sub-pixels above and below the white sub-pixel overlapping with the corresponding sub-pixel; and m is the width the semiconductor layer of the TFT entering the sub-pixels above and below the white sub-pixel overlapping with the corresponding sub-pixel.

2. The RGBW display panel as claimed in claim 1, wherein each gate line further comprises a straight portion disposed between two bending portions for connecting the two bend portions.

3. The RGBW display panel as claimed in claim 1, wherein the RGBW display panel further comprises a substrate, a shielding layer disposed on the substrate and below the semiconductor layer for shielding; the semiconductor layer is made of polysilicon.

4. An RGBW display panel, comprising: a plurality of gate lines, a plurality of data lines intersecting with the plurality of gate data in an insulating manner, a plurality of sub-pixels defined by the plurality of gate lines and the plurality of data lines and arranged in an array, a plurality of thin film transistors (TFTs), and a black matrix covering the gate lines and data lines; a TFT is disposed correspondingly to a sub-pixel;

the plurality of sub-pixels comprising a plurality of red sub-pixels, a plurality of green sub-pixels, a plurality of blue sub-pixels, and a plurality of white sub-pixels; for vertically adjacent or horizontally adjacent red sub-pixels, green sub-pixels, blue sub-pixels, and white sub-pixels, the TFTs for the red sub-pixels, green sub-pixels, and blue sub-pixels being disposed inside the white sub-pixels;

each gate line comprising a plurality of bend portions, the bend portions being located on borders of the sub-pixels left and right to the white sub-pixel to increase the aperture ratio of the sub-pixels located above and below the white sub-pixel;

wherein the bend portion comprising a first bend segment and a second bend segment; the first bend segment being relatively far away from the white sub-pixel and bending towards the white sub-pixel; and the second bend segment being relatively near the white sub-pixel and bending towards the white sub-pixel;

wherein the bend portion further comprising a straight segment connecting the first bend segment and the second bend segment;

wherein a TFT is located at four corners of the white sub-pixel respectively; the TFT comprises a semiconductor layer, a gate disposed above the semiconductor layer, insulated from the semiconductor layer and connected to the gate line, a source disposed above the gate, insulated from the gate and connected to the data line, a drain at the same layer as the data line; the drain is connected to the semiconductor layer;

a portion of the semiconductor layer extends beyond the white sub-pixel and enters the sub-pixels above and below the white sub-pixel;

wherein the height difference between highest point and lowest point of the first bend segment is equal to the height difference between highest point and lowest point of the second bend segment; the angle between the first bend segment and a vertical direction is equal to the angle between the second bend segment and a vertical direction;

wherein assume that both the height difference between highest point and lowest point of the first bend segment and the height difference between highest point and lowest point of the second bend segment are d; both the angle between the first bend segment and a vertical direction and the angle between the second bend segment and a vertical direction are $\alpha$, the aperture ratio increment $\Delta AR2$ for the sub-pixels above and below the white sub-pixel is:

$\Delta AR2=2\times(b-s)\times d/(a\times b)$, wherein a is the nominal height of the sub-pixel, b is the nominal width of the sub-pixel, and s is the shielding width of the black matrix;

wherein the equation for computing the height difference between highest point and lowest point of the first bend segment and the height difference between highest point and lowest point of the second bend segment d is:

$d=2\times 1\times m/[s(tg\alpha-1)+b]$, wherein 1 is the height of the semiconductor layer of the TFT entering the sub-pixels above and below the white sub-pixel overlapping with the corresponding sub-pixel; and in is the width the semiconductor layer of the TFT entering the sub-pixels above and below the white sub-pixel overlapping with the corresponding sub-pixel.

5. The RGBW display panel as claimed in claim 4, wherein the RGBW display panel further comprises a substrate, a shielding layer disposed on the substrate and below the semiconductor layer for shielding; the semiconductor layer is made of polysilicon.

6. An RGBW display panel, comprising: a plurality of gate lines, a plurality of data lines intersecting with the plurality of gate data in an insulating manner, a plurality of sub-pixels defined by the plurality of gate lines and the plurality of data lines and arranged in an array, a plurality of thin film transistors (TFTs), and a black matrix covering the gate lines and data lines; a TFT is disposed correspondingly to a sub-pixel;

the plurality of sub-pixels comprising a plurality of red sub-pixels, a plurality of green sub-pixels, a plurality of blue sub-pixels, and a plurality of white sub-pixels; for vertically adjacent or horizontally adjacent red sub-pixels, green sub-pixels, blue sub-pixels, and white sub-pixels, the TFTs for the red sub-pixels, green sub-pixels, and blue sub-pixels being disposed inside the white sub-pixels;

each gate line comprising a plurality of bend portions, the bend portions being located on borders of the sub-pixels left and right to the white sub-pixel to increase the aperture ratio of the sub-pixels located above and below the white sub-pixel;

wherein the bend portion comprises a first bend segment and a second bend segment; the first bend segment is relatively far away from the white sub-pixel and bends towards the white sub-pixel; and the second bend segment is relatively near the white sub-pixel and bends towards the white sub-pixel;

wherein the height difference between highest point and lowest point of the first bend segment is equal to the height difference between highest point and lowest point of the second bend segment; the angle between the first bend segment and a vertical direction is equal to the angle between the second bend segment and a vertical direction;

wherein assume that both the height difference between highest point and lowest point of the first bend segment and the height difference between highest point and lowest point of the second bend segment are d; both the angle between the first bend segment and a vertical direction and the angle between the second bend segment and a vertical direction are α, the aperture ratio increment ΔAR2 for the sub-pixels above and below the white sub-pixel is:

$\Delta AR2=2\times(b-s)\times d/(a\times b)$, wherein a is the nominal height of the sub-pixel, b is the nominal width of the sub-pixel, and s is the shielding width of the black matrix;

wherein the equation for computing the height difference between highest point and lowest point of the first bend segment and the height difference between highest point and lowest point of the second bend segment d is:

$d=2>1\times m/[s(tg\alpha-1)+b)]$, wherein 1 is the height of the semiconductor layer of the TFT entering the sub-pixels above and below the white sub-pixel overlapping with the corresponding sub-pixel; and in is the width the semiconductor layer of the TFT entering the sub-pixels above and below the white sub-pixel overlapping with the corresponding sub-pixel.

7. The RGBW display panel as claimed in claim 6, wherein each gate line further comprises a straight portion disposed between two bending portions for connecting the two bend portions.

8. The RGBW display panel as claimed in claim 6, wherein the RGBW display panel further comprises a substrate, a shielding layer disposed on the substrate and below the semiconductor layer for shielding; the semiconductor layer is made of polysilicon.

\* \* \* \* \*